US006989666B2

(12) United States Patent
Kawase (10) Patent No.: US 6,989,666 B2
(45) Date of Patent: Jan. 24, 2006

(54) CURRENT SENSOR AND CURRENT DETECTION UNIT USING THE SAME

(75) Inventor: Masahiro Kawase, Saitama (JP)

(73) Assignee: Canon Denshi Kabushiki Kaisha, Saitama-ken (JP)

( * ) Notice: Subject to any disclaimer, the term of this patent is extended or adjusted under 35 U.S.C. 154(b) by 0 days.

(21) Appl. No.: 10/810,580

(22) Filed: Mar. 29, 2004

(65) Prior Publication Data
US 2004/0201374 A1    Oct. 14, 2004

(30) Foreign Application Priority Data
Apr. 11, 2003   (JP)   ............................. 2003-107944

(51) Int. Cl.
*G01R 33/00* (2006.01)
(52) U.S. Cl. ................................. 324/117 R
(58) Field of Classification Search ............... 324/117, 324/127
See application file for complete search history.

(56) References Cited

U.S. PATENT DOCUMENTS

| 3,056,922 | A   | * | 10/1962 | Du Vall et al. | ............ 368/113 |
| 6,456,068 | B1  |   | 9/2002  | Kawase | ....................... 324/249 |
| 6,459,255 | B1  | * | 10/2002 | Tamai et al. | ............ 324/117 H |
| 6,636,029 | B1  |   | 10/2003 | Kunze et al. | ................ 324/117 |
| 6,642,705 | B2  |   | 11/2003 | Kawase | ....................... 324/117 |
| 2004/0008026 | A1 |   | 1/2004  | Kawase | ....................... 324/249 |

FOREIGN PATENT DOCUMENTS

| DE | 195 49 181   | 7/1997  |
| DE | 198 38 536   | 3/2000  |
| EP | 1 199 573    | 4/2002  |
| JP | 2002-107384  | 10/2002 |
| JP | 2003-028899  | 1/2003  |

* cited by examiner

Primary Examiner—Paresh Patel
(74) Attorney, Agent, or Firm—Fitzpatrick, Cella, Harper & Scinto (57) ABSTRACT

A current sensor does not have large dimensions but is adapted to highly sensitively detect an electric current and can be manufactured with ease at low cost. The current sensor comprises parallel electric wire sections of a pair of electric wires arranged in parallel with each other and adapted to flow respective electric currents of the same intensity in directions opposite to each other and a magnetic detection device arranged on a prolonged line connecting the center axes of the parallel electric wire sections. The magnetic detection device has a magnetic field detecting direction rectangular relative to said prolonged line and is adapted to detect the difference between the magnetic field formed by the parallel electric wire section located close to the magnetic detection device and the magnetic field formed by the parallel electric wire section located remote from the magnetic detection device and directed oppositely relative to the former magnetic field in order to detect the intensity of the electric currents flowing through said parallel electric wire sections.

13 Claims, 7 Drawing Sheets

CURRENT SENSOR AND CURRENT DETECTION UNIT USING THE SAME

BACKGROUND OF THE INVENTION

1. Field of the Invention

This invention relates to a current sensor for detecting an electric current flowing through a signal line. More particularly, the present invention relates to a high sensitivity current sensor for detecting an electric current by using a magneto-impedance device or a flux-gate sensor whose magnetic permeability changes in response to the external magnetic field and also to a current detection unit using such a current sensor.

2. Related Background Art

Conventionally, current transformers and hall devices are used as current sensors for detecting an electric current. The current sensor market is expected to expand as electric automobiles have come on the scene and power monitoring for the purpose of power saving has been promoted in recent years. Current detecting operations have been increasingly ramified as a result of advancement of current management using networks and accordingly the detection range of current detecting operations has been lowered. As a result, there is an increasing demand for highly sensitive current sensors. In short, as the detection range of current detecting operations lowers, the magnetic sensors to be used for the detecting operations are required to show a higher S/N ratio.

In such a trend, the use of magneto-impedance devices and flux-gate sensors that are more sensitive than conventional hall devices is highly promising. Then, it is important to realize a compact current sensor by using such a sensitive device.

Figure 9:
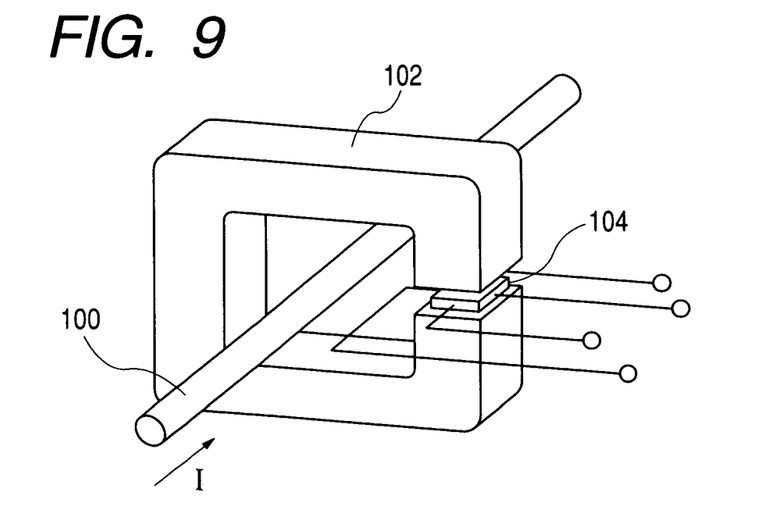
FIG. 9 is a schematic perspective view of a current sensor comprising a conventional hall device.

FIG. 9 of the accompanying drawings shows a known typical current sensor that comprises a magnetic circuit by a C-shaped magnetic core 102 turned around an electric wire 100 and a hall device 104 arranged in the gap of the magnetic core 102. The hall device 104 does not show saturation and hence can operate in a strong magnetic field because it is not ferromagnetic.

However, magneto-impedance devices and flux-gate sensors are formed by using a ferromagnetic substance and hence require to be used within a non-saturation range because they show magnetic saturation. In other words, when a magnetic circuit is configured by using a magneto-impedance device or a flux-gate sensor like the one using a hall device, the magnetic field of the gap becomes too strong and magnetic saturation appears easily if an electric current in the order of amperes is detected. Thus, a circuit configuration like that of a circuit using a hall device is not feasible when a magneto-impedance device or a flux-gate sensor is involved.

Additionally, it is necessary for a high sensitivity magnetic sensor, when it is ferromagnetic, to confine the magnetic field detection range to about ±15 gausses (±1.5 milliteslas or mT) if a wide detection range can be realized by using negative feedback or the like for the drive circuit. In other words, when the magnetic field from an electric wire is to be detected directly, the distance needs to be adjusted so that intensity of the magnetic field may be found within the above detection range.

However, the current sensor may confront dimensional limitations if the combination of a device and an electric wire is switched from one to another depending on the required current detection range. Then, the applicability of such a current sensor will also be limited. Particularly, a current sensor adapted to large electric currents may need to have large dimensions.

Furthermore, the magnetic fields produced from some electric parts other than the target electric wire that may include power transformers need to be handled appropriately. If a magnetic shield is used, conditions for using such a shield need to be considered so that the shield may not influence the magnetic field produced from the electric wire nor be magnetically saturated.

SUMMARY OF THE INVENTION

It is, therefore, an object of the present invention to provide a current sensor and a current detection unit using it that do not have large dimensions but are adapted to highly sensitively detect an electric current and can be manufactured with ease at low cost.

According to the invention, the above object is achieved by providing a current sensor using a magnetic detection device having a magnetic body adapted to allow high frequency currents to directly flow through it and change its magnetic permeability in response to the external magnetic field, said sensor comprising:

parallel electric wire sections of a pair of electric wires arranged in parallel with each other and adapted to flow respective electric currents of the same intensity in directions opposite to each other; and said magnetic detection device arranged on a prolonged line connecting the center axes of said parallel electric wire sections; wherein said magnetic detection device has a magnetic field detecting direction rectangular relative to the prolonged line and is adapted to detect the difference between the magnetic field formed by the parallel electric wire section located close to the magnetic detection device and the magnetic field formed by the parallel electric wire section located remote from the magnetic detection device and directed oppositely relative to the former magnetic field in order to detect the intensity of the electric currents flowing through said parallel electric wire sections.

DESCRIPTION OF THE PREFERRED EMBODIMENTS

Figure 1:
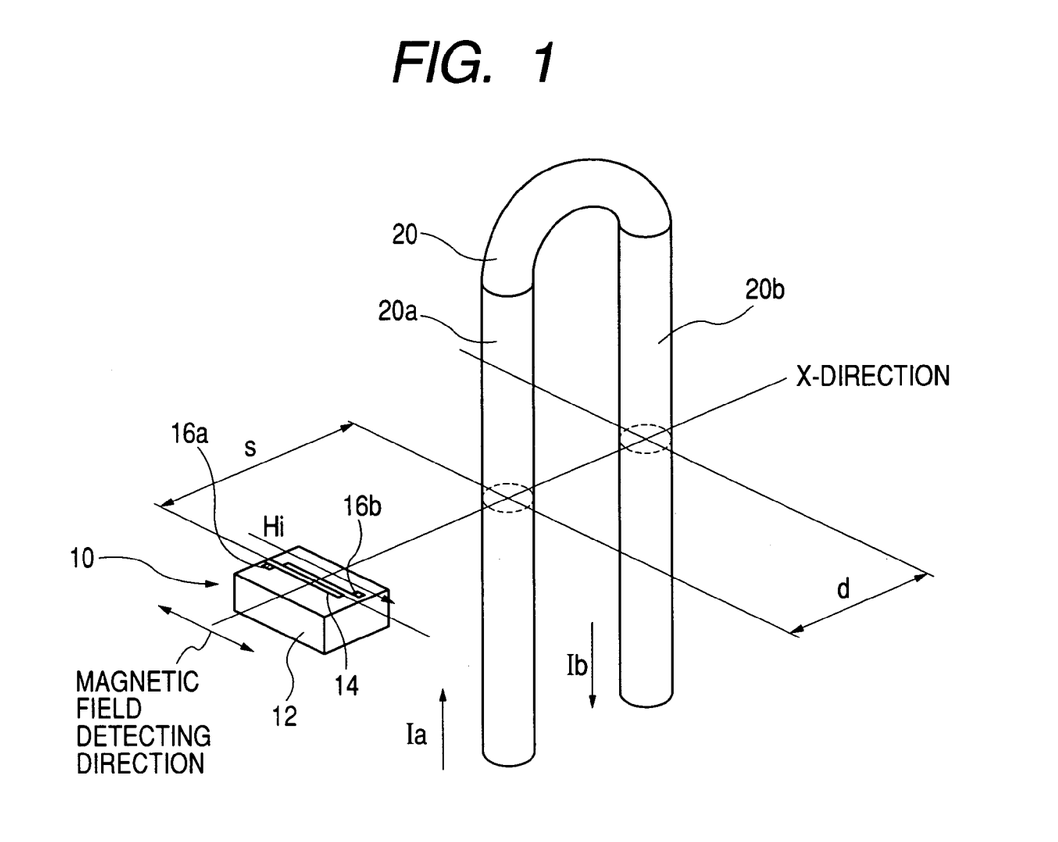
FIG. 1 is a schematic perspective view of an embodiment of current sensor according to the invention.

Now, the present invention will be described in greater detail by referring to the accompanying drawings that illustrate preferred embodiments of the invention. FIG. 1 is a schematic perspective view of an embodiment of current sensor according to the invention, illustrating the relative position relationship between the magnetic detection device and the electric wire for detecting the electric current flowing through it.

Referring to FIG. 1, magnetic detection device 10 is a magneto-impedance device (to be referred to as MI device hereinafter) that is adapted to directly flow a high frequency current to a magnetic body (magnetic thin film) 14 formed on a non-magnetic substrate 12 and changes its impedance in response to the external magnetic field. For the magnetic detection device 10, the MI device may alternatively be formed not by using a thin film but by using an amorphous wire. Still alternatively, it may be adapted to operate as flux-gate sensor adapted to take out an output from a coil arranged near or wound around the magnetic detection device 10.

As shown in FIG. 1, the MI device is realized by folding the magnetic thin film 14 to show a zigzag pattern on the non-magnetic substrate 12 such as glass and provided at the opposite ends with electrodes 16a, 16b to which a high frequency electric current can be applied. The magnetic field detecting direction of the MI device runs in parallel with the longitudinal direction of the pattern of the magnetic thin film 14 as indicated by arrow Hi.

The target electric wire 20 whose magnetic field is to be detected by the magnetic detection device 10 has parallel electric wire sections 20a, 20b produced by bending the electric wire 20 at an end of the parallel electric wire section 20a and the corresponding end of the parallel electric wire section 20b. The prolonged line connecting the center axes of the parallel electric wire sections 20a, 20b extends in X-direction and the magnetic detection device 10 is arranged on the prolonged line. The magnetic field detecting direction and the direction in which the parallel electric wire sections are arranged are substantially rectangular relative to each other.

Figure 2A:
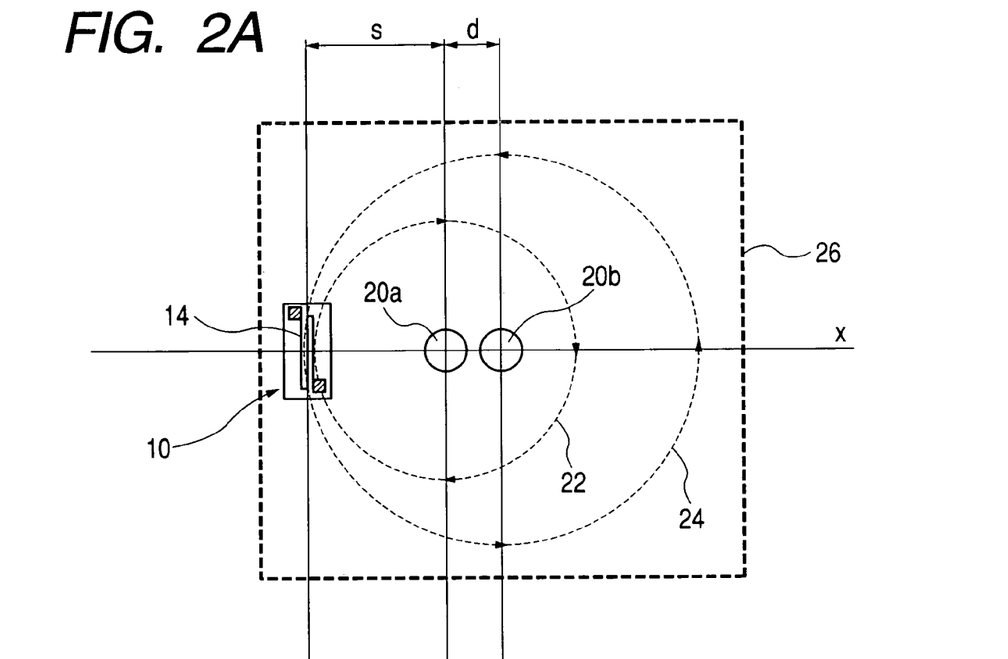
FIGS. 2A and 2B are schematic plan views of the embodiment of FIG. 1.

FIG. 2A is a schematic plan view of the magnetic detection device when the device is viewed from above in terms of the viewpoint of FIG. 1. Assume that the parallel electric wire section 20a located close to the magnetic detection device 10 and the parallel electric wire section 20b located remote from the magnetic detection device 10 are separated from each other by gap d and the distance between the center of the magnetic body 14 that is the detecting section of the device and the center of the parallel electric wire section 20a close to the magnetic detection device 10 is s.

The magnetic field H at the magnetic detection device 10 is expressed by the difference between the inverse functions of the respective distances from the parallel electric wire sections. If the electric wire 20 is assumed to have an infinite length for the purpose of simplicity, the magnetic field H is expressed by the formula below.

$$H=(1/s)-(1/(s+d))=(1\times d)/s(s+d)$$

Figure 2B:
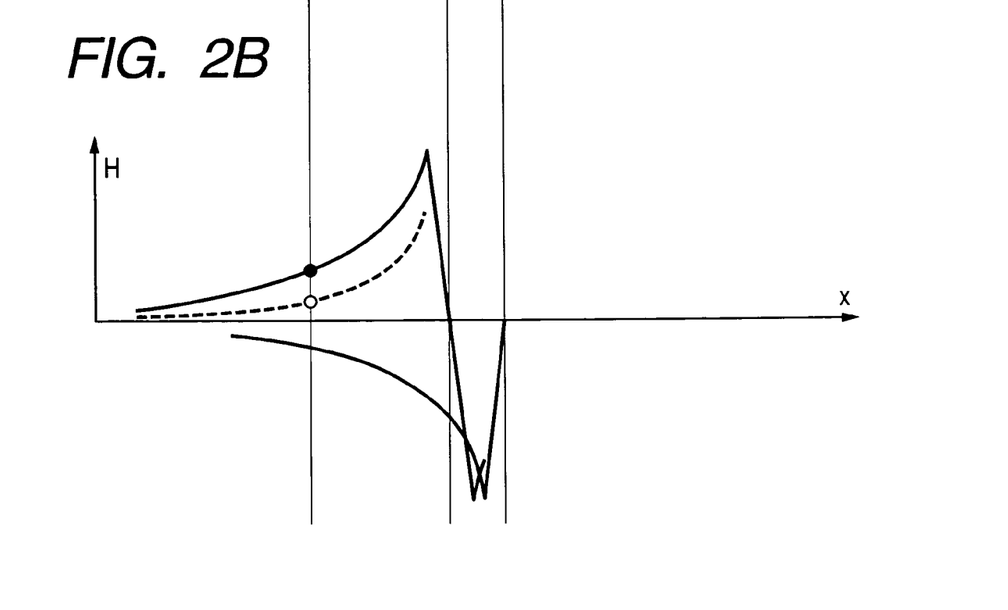

FIG. 2B illustrates the relationship between the magnetic field and the distance. The upper solid curve represents the magnetic field due to the parallel electric wire section 20a and the lower solid curve represents the magnetic field due to the parallel electric wire section 20b. The broken curve represents the synthetic magnetic field obtained from the magnetic field due to the parallel electric wire section 20a and the magnetic field due to the parallel electric wire section 20b.

The direction of the electric current flowing through the parallel electric wire section 20b located remote from the magnetic detection device 10 is inverse relative to the direction of the electric current flowing through the parallel electric wire section 20a located close to the magnetic detection device 10 so that the synthesized magnetic field relative to the magnetic detection device 10 can be weakened as a function of distance d as indicted by the broken curve in FIG. 2B. In other words, while a conventional current sensor is separated from the target signal line by a large distance when it detects an intense magnetic field due to a large electric current, the magnetic detection device of a current sensor according to the invention can be brought close to the target signal line when the latter is made to have two parallel electric wire sections through which respective electric currents flow in opposite directions and the gap d between the two parallel electric wire sections is reduced.

More specifically, the magnetic field is attenuated to ½ of the magnetic field observed when the target signal line is a single line if d=s. Similarly, the magnetic field is attenuated to ⅓ of the magnetic field observed when the target signal line is a single line if d=s/2. When the required effect is taken into consideration, it may be desirable to make d smaller than s for the basic configuration of the current sensor.

From the viewpoint of applicability of a current sensor, it is possible to apply a magnetic field necessary for the device section without changing the external dimensions of the current sensor by selecting appropriate values for s and d depending on the requirements of the specifications that need to be met for the electric current to be detected. In other words, a current sensor according to the invention can be adapted to various products whose requirements of the specifications are diverse only by changing the positional relationship of the parallel electric wire sections as a function of the specifications of the product without changing both the external dimensions of the product and the requirements for the circuit.

In the case of a highly sensitive magnetic sensor, the magnetic field detection range of the current sensor is about ±3 gausses (±300 $\mu$T) where a good linearity is provided, which can be expanded to a five times wider range by using a feedback circuit. Thus, the upper limit of range may be about ±15 gausses (±1.5 mT). Therefore, the gap between the two parallel electric wire sections and the distance from the magnetic detection device need to be adjusted so that the magnetic field detection range may be found within this range and the maximum current metering range may not exceed these values.

While a single magnetic detection device is used, a magnetic shield member needs to be used to shield the device against any external magnetic field, the magnetic shield can disturb the magnetic field produced by the electric current if the shield member is not arranged at appropriate position.

While the magnetic field of an electric wire shows a circular contour that is centered at the axis thereof, the tendency of absorbing the magnetic flux of a shield member is intensified when the shield member formed by a magnetic body is located within the circle. Therefore, the wall surface of the shield member needs to be separated from the electric wire by a distance at least greater than the distance between the electric wire and the detecting section of the device. This will be described by referring to FIG. 2A. When a magnetic shield member is found in the circular magnetic fields 22, 24, which are formed respectively by the parallel electric wire sections 20a, 20b and pass through the magnetic detection device 10, the tendency that the magnetic flux passes through the shield member is intensified, and the metering by the magnetic detection device 10 is largely influenced by the magnetic field disturbance. Therefore, it is important that the magnetic shield member 26 that surrounds the measuring system does not intersect the circle having a half diameter of s+d, as shown in FIG. 2A.

Figure 3:
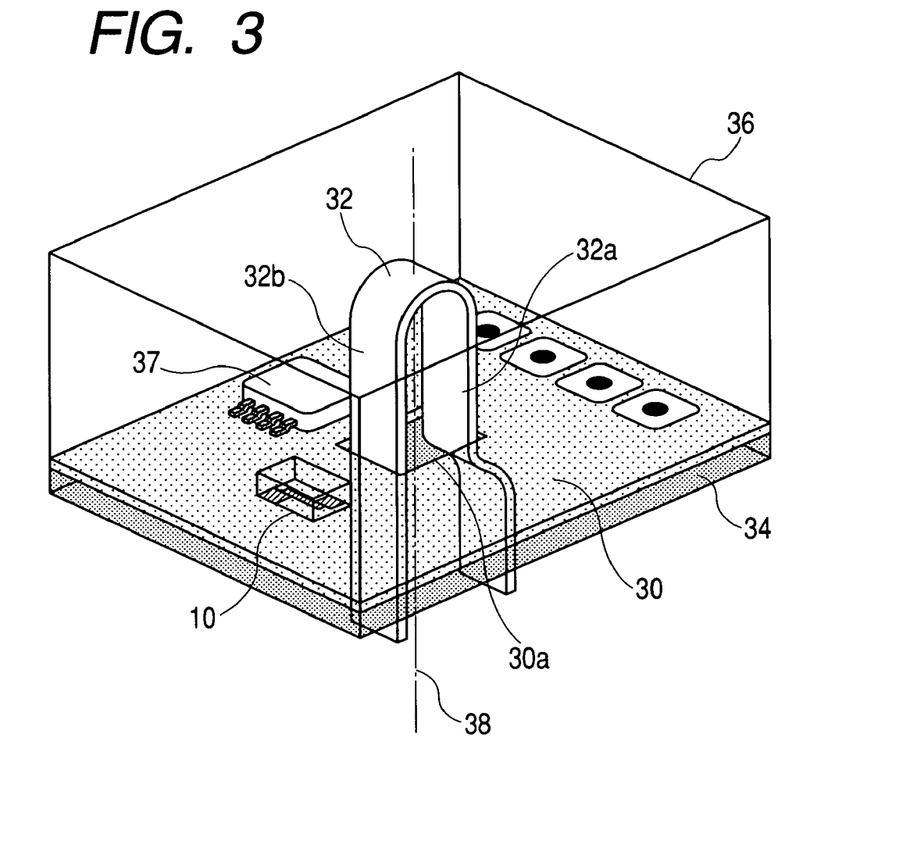
FIG. 3 is a schematic perspective view of an embodiment of current detection unit realized by using a current sensor as shown in FIG. 1.

Now, the structure of a compact current sensor according to the invention will be described by taking productivity into consideration. FIG. 3 is a schematic perspective view of an embodiment of current detection unit realized by mounting a magnetic detection device as shown in FIG. 1 on a flat circuit substrate 30.

Referring to FIG. 3, the magnetic detection device 10 is mounted with other electric parts on the circuit substrate 30 in such a way that the side where the electrodes 16a, 16b are arranged faces downward. In FIG. 3, reference symbol 37 denotes a drive circuit IC for applying a high frequency current to the magnetic body 14 and taking out the sensor output as will be described in greater detail hereinafter. The electric wire 32 is formed by punching out and bending an electrically conductive material having a low electric resistance such as copper. The electric wire 32 has parallel electric wire sections 32a, 32b, which are separated by a gap that is broadened at the open ends of the parallel electric wire sections 32a, 32b, which open ends operate as terminals. With this structure, the outermost dimensions of the terminals can be made common to a series of products so long as the gap separating the open ends are held sufficiently wide if the gap between the parallel electric wire sections is varied depending on the specifications of product and according to the electric current to be detected.

While the electric wire of FIG. 1 has a circular cross section, the electric wire 32 of FIG. 3 may show a rectangular cross section. Rather, the electric wire 32 may preferably have a rectangular cross section because the magnetic detection device 10 and the electric wire can be brought closer to each other when the electric wire has such a cross section. Additionally, while the magnetic field applied to the magnetic detection device has an arc-shaped contour when the electric wire has a circular cross section, the magnetic field has a contour that is extended in the magnetic field detecting direction when the electric wire has a rectangular cross section to advantageously make the distribution of the magnetic field applied to the magnetic detection device linear and stable. It is preferably that the width of the rectangular cross section of the parallel electric wire sections 32a, 32b is greater than the length of the magnetic body 14 that operates as detecting section of the device in the magnetic field detecting direction.

The electric wire 32 is arranged through a through hole or a notch 30a formed in the circuit substrate 30 and the magnetic detection device 10 is arranged in the direction in which the axes of the parallel electric wire sections 32a, 32b are arranged. With this structure, a current detection unit can be assembled with ease by way of a step of arranging an electric wire 32 so as to stand through a base member 34, a step of putting a circuit substrate 30 carrying thereon a magnetic detection device 10 on the base member 34 and a step of covering the above components with a magnetic shield member 36.

Additionally, current sensors require mass production and hence the above-described assembling process is suited to manufacturing current sensors. Furthermore, current sensors that can cover a considerably wide spectrum of electric current can be produced simply by rigidly securing the circuit substrate 30, the magnetic shield member 36 and the center axis 38 of the electric wire 32 relative to each other and changing the gap d between the parallel electric wire sections 32a and 32b. This arrangement is free from cumbersome operations of preparing and selecting different peripheral parts depending on the specifications adapted to a given electric current range.

Figure 4:
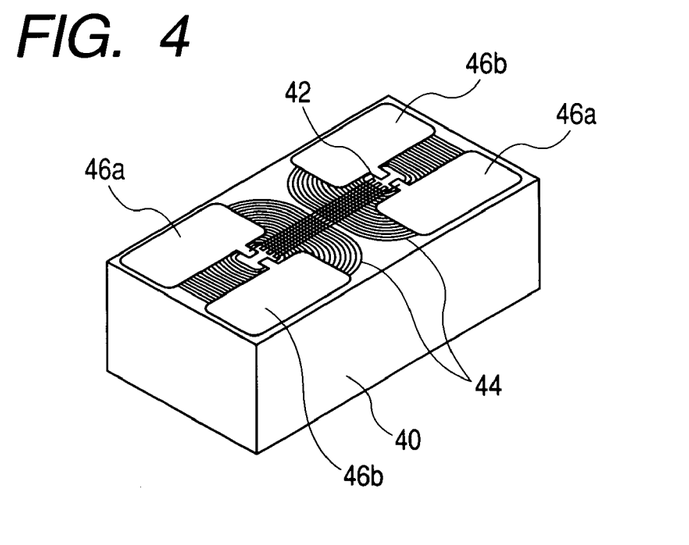
FIG. 4 is a schematic perspective view of the current sensor used in an experiment for evaluating the present invention.

Now, the evaluation outcome of current detection units according to the invention will be described below. FIG. 4 is a schematic perspective view of the current sensor used in an experiment for evaluating the present invention. In the illustrated current sensor, an MI device 42 was formed from a strip of magnetic thin film on a non-magnetic substrate 40 and a spiral coil 44 was formed thereon. The opposite ends of the MI device 42 were connected to electrodes 46a, 46b.

The spiral coil 44 included a left side coil and a right side coil that were connected to each other. The inner end of the left side coil was connected to the electrode 46b, while the inner end of the right side coil was connected to the other electrode 46b. Thus, as the MI device 42 was electrically energized, the output could be taken out from the coil 44.

Figure 5:
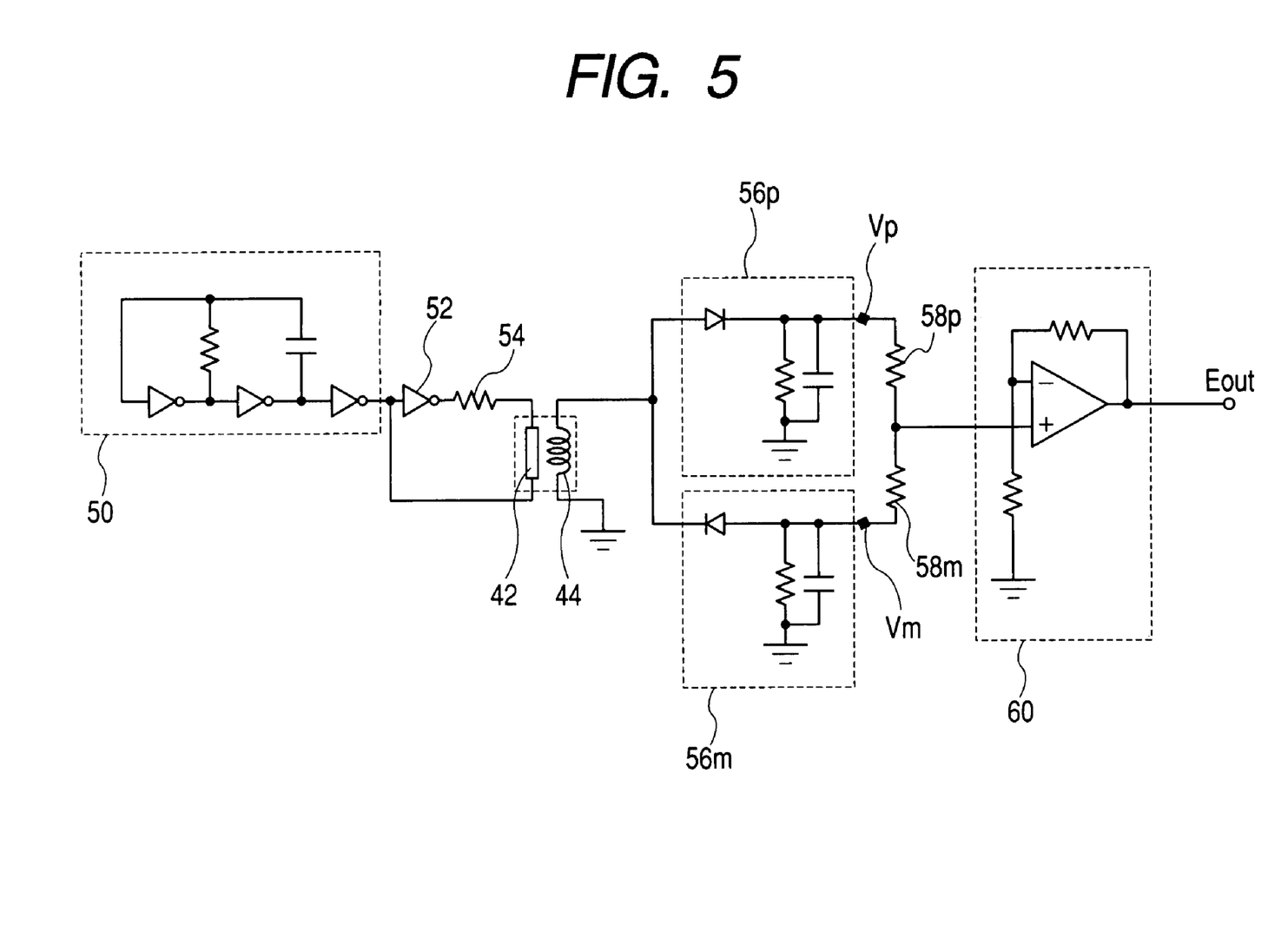
FIG. 5 is a schematic circuit diagram of the drive circuit used in an experiment for evaluating the present invention.

FIG. 5 is a schematic circuit diagram of the drive circuit of the current sensor. In this instance, a high frequency electric current was applied to the magnetic body 14 and the change in the permeability was taken out as coil output. Firstly, a high frequency electric current was applied to the MI device 42 uniformly in terms of positive and negative from a pulse oscillator 50 by way of a buffer 52 and an electric current adjusting resistor 54. The output of the coil 44 changed in response to the external magnetic field and the peaks of the change at the positive and negative sides were taken out respectively by means of detection circuits 56p, 56m and the signals of the middle points were output respectively from resistors 58p, 58m so that the sensor output Eout could be obtained by amplifying the signal by means of amplifier 60.

Although not shown, it is possible to provide a feed back circuit configuration so as to improve the accuracy and broaden the current detection range by winding a solenoid-shaped coil around the magnetic detection device along the magnetic field detecting direction and connecting the output Eout to the ground by way of a feedback adjusting resistor.

As for the dimensions of the electric wire, a U-shaped electric wire was formed by using a copper wire having a cross section that is 5 mm wide and 1.5 mm thick and separating the parallel electric wire sections by a gap of 3 mm and the electric wire section located close to magnetic detection device and the detection axis of the magnetic detection device by a distance of 4.5 mm (the height of the electric wire was 21.5 mm). The drive circuit of FIG. 5 was driven by a supply voltage of 5V and the gain of the amplifier 60 was selected to be 100 times. The current sensor was enclosed in a shield of Permalloy.

Figure 6:
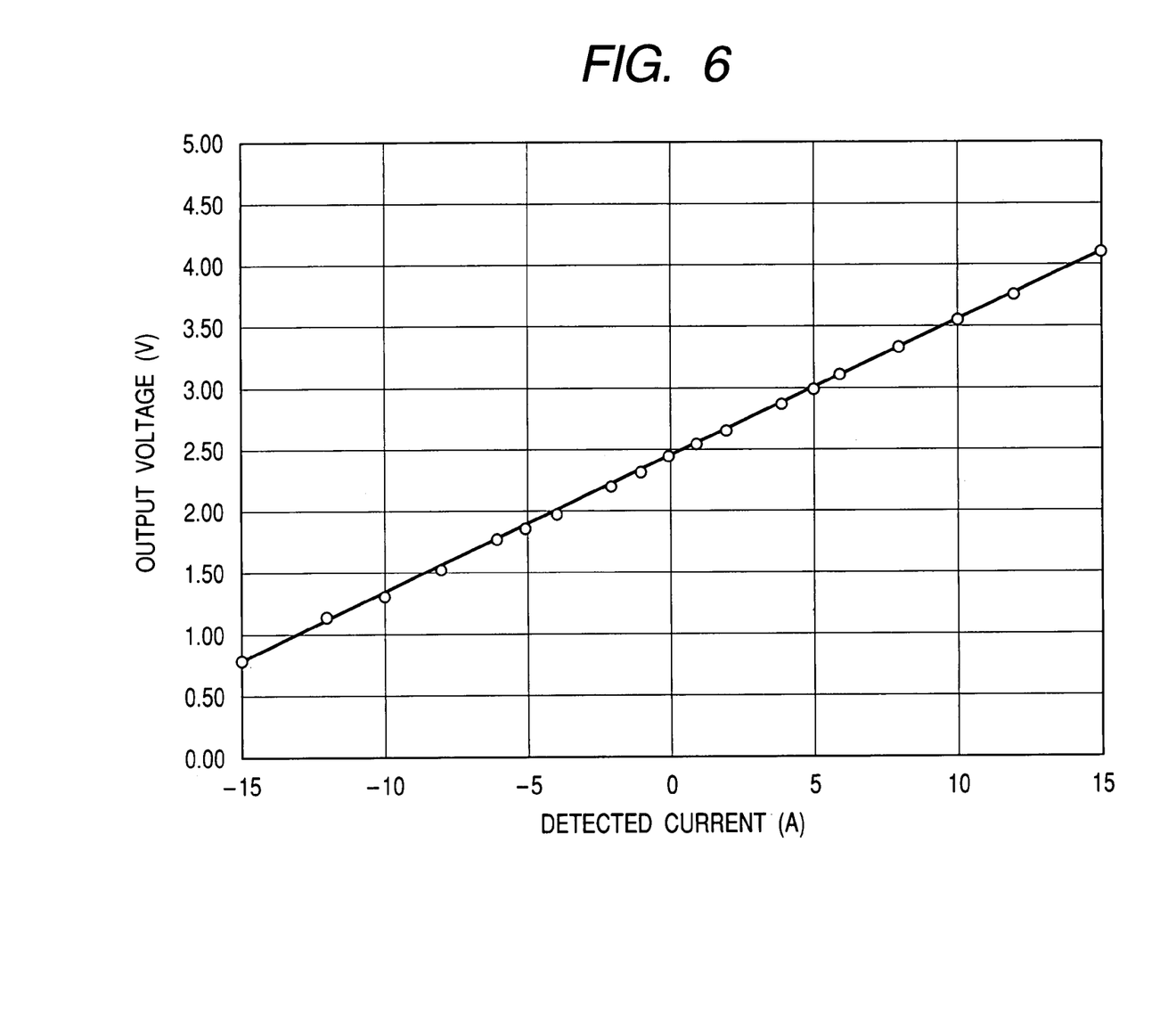
FIG. 6 is a graph showing the current detection characteristic of the current sensor obtained as a result of the experiment for evaluating the present invention.

FIG. 6 is a graph showing the current detection characteristic of the current sensor for DC ±15A. It will be seen that an excellent linearity was obtained. When computed back from the inclination of the line and the magnetic field detecting characteristics of the magnetic detection device, it was found that the magnetic field was 0.08 gausses (8 $\mu$T) per 1A. Assuming that the two parallel electric wire sections have an infinite length and that respective electric currents flow in opposite directions, the magnetic field will be 0.178 gausses (17.8 $\mu$T) when determined by computation. However, the actual magnetic field was less than a half of it because of the fact that the electric wire had a definite length and a magnetic circuit was formed through the shield. If a current detection system is constituted by means of a similar arrangement, using a single line having an infinite length without a shield, the magnetic detection device and the electric wire will have to be separated by a distance of 25 mm. Therefore, the above-described arrangement can reduce the distance between the magnetic detection device and the electric wire to ¼ or less, which will be very significant when downsizing the current sensor.

Figure 7:
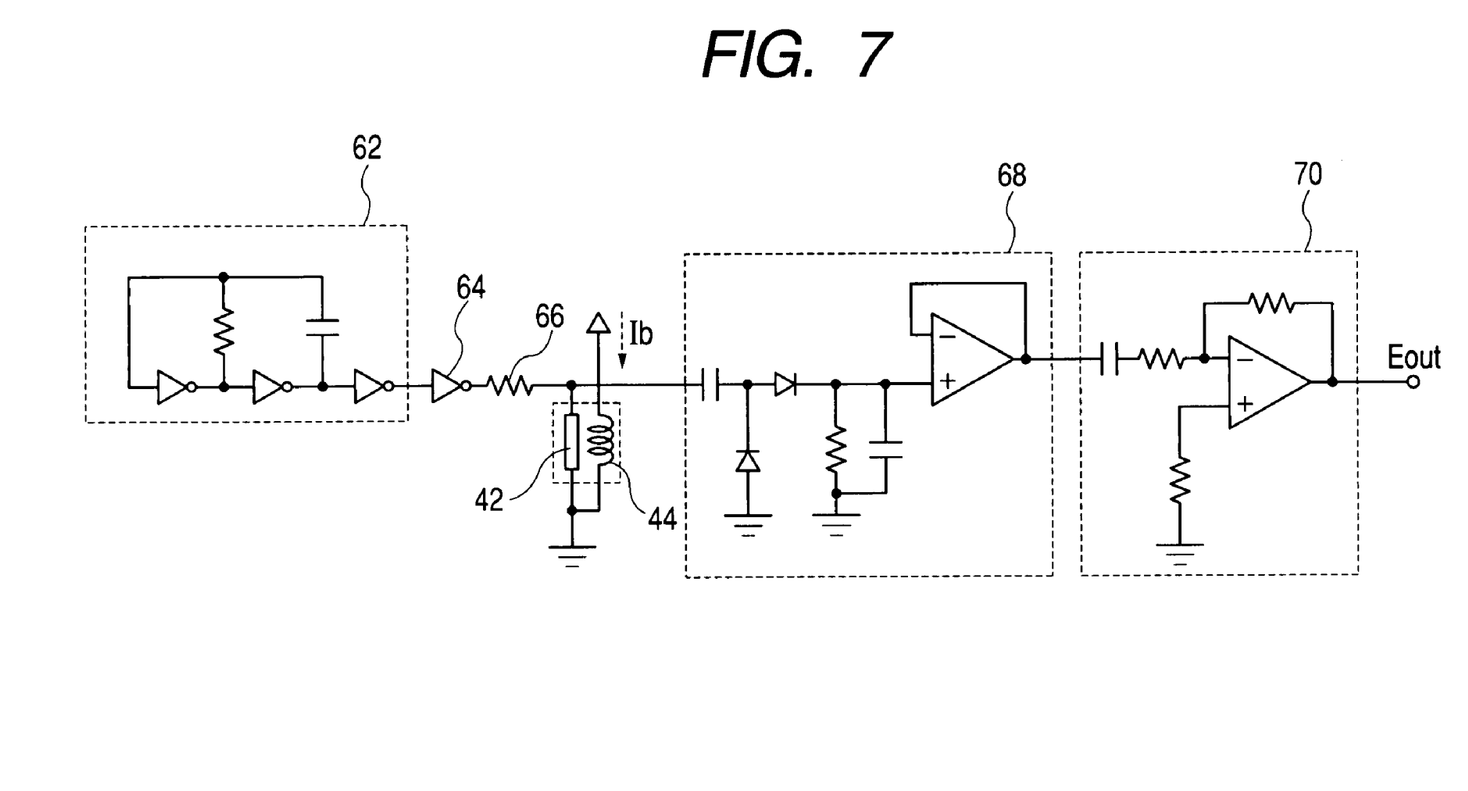
FIG. 7 is a schematic circuit diagram of another drive circuit.

FIG. 7 is a schematic circuit diagram of another drive circuit. This circuit is designed to apply a high frequency current to the magnetic body 14 and take out the change in the impedance thereof. While a current sensor as shown in FIG. 4 is also used, the spiral coil 44 is used for a bias magnetic field and the sensor output is taken out as the change in the voltage amplitude relative to the high frequency current for energizing the MI device 42. In FIG. 7, reference symbol 62 denotes an oscillation circuit for electrically energizing the MI device 42 by means of a high frequency current by way of buffer 64 and an electric current adjusting resistor 66.

A DC bias current Ib is applied to the spiral coil 44. The change in the magnetic field due to the high frequency current appears as a change in the voltage amplitude at the opposite ends of the MI device 42 so that the sensor output is obtained by causing the output to pass through a detecting circuit 68 and amplifying it by means of an amplifier circuit 70.

Figure 8:
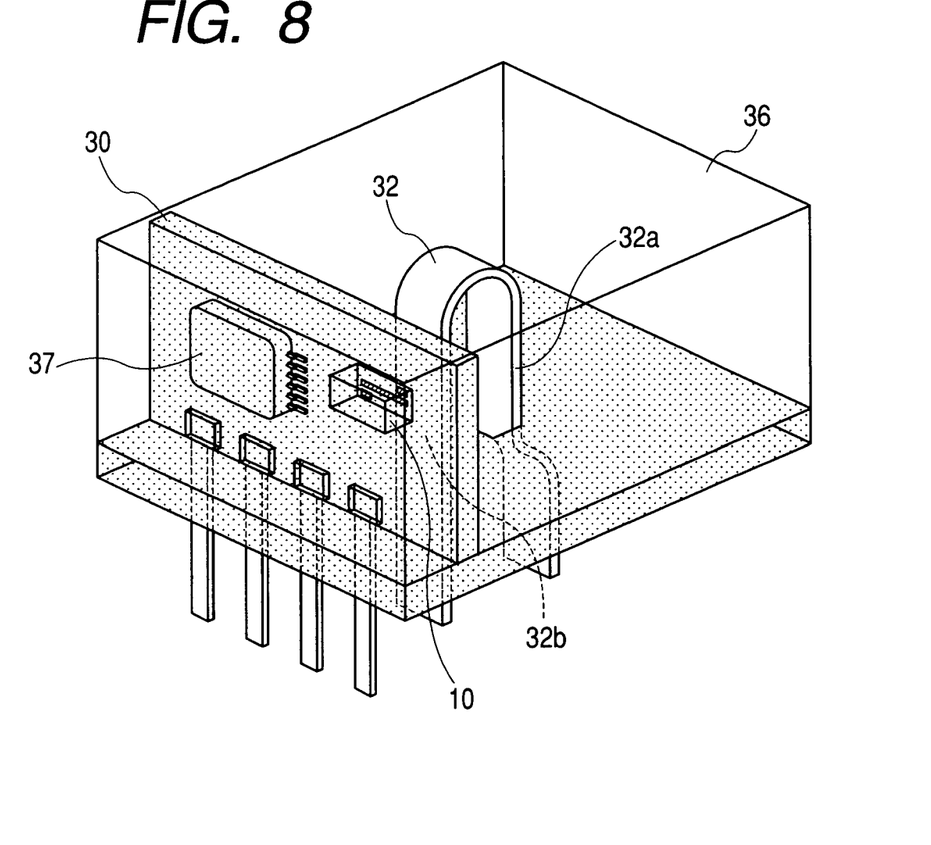
FIG. 8 is a schematic perspective view of another embodiment of current detection unit.

FIG. 8 is a schematic perspective view of another embodiment of current detection unit. In FIG. 8, the components same as those of FIG. 3 are denoted respectively by the same reference symbols. As shown in FIG. 8, the circuit substrate 30 that carries a magnetic detection device 10 is arranged so as to be standing in parallel with the parallel electric wire sections and the magnetic detection device 10 is arranged on a prolonged line extending in the direction of arrangement of the parallel electric wire sections 32a, 32b. This arrangement operates equally well so long as the magnetic field detecting direction is rectangular relative to the direction of arrangement the parallel electric wire sections 32a, 32b.

As described in detail above, according to the invention, it is possible to form a current sensor whose dimensions may not be increased when it is used for a large electric current by using a high sensitivity magnetic detection device. In short, it is possible to realize a high sensitive compact current sensor. Additionally, since the magnetic detection device and the electric wire do not contact each other, they do not influence each other from the viewpoint of electric circuit so that the influence of the impedance inserted to the current signal to be detected and the influence of other interferences are non-existent.

Still additionally, since no significantly large magnetic flux is generated, it is not necessary to provide a large magnetic shield. Therefore, unlike conventional current detectors, magnetic saturation and other factors do not need to be considered for the magnetic shield. Furthermore, unlike conventional current detectors that comprise a magnetic core such as a hall device, it is no longer necessary to care about the problem of heat generation due to the hysteresis loss of the core member.

Furthermore, current detection units can be manufactured with a high productivity when the magnetic detection device is mounted on a circuit substrate and the reciprocal parallel electric wire sections are made to run through a through hole or a notch or when the substrate carrying the magnetic detection device is arranged in parallel with the electric current.

What is claimed is:

1. A current sensor using a magnetic detection device having a magnetic body adapted to allow high frequency currents to directly flow through it and change its magnetic permeability in response to the external magnetic field, said sensor comprising:

parallel electric wire sections of a pair of electric wires arranged in parallel wit each other and adapted to flow respective electric currents of the same intensity in directions opposite to each other, wherein said magnetic detection device has a magnetic field detecting direction rectangular relative to a prolonged line connecting centers of said parallel electric wire sections and is adapted to detect the difference between the magnetic field formed by the parallel electric wire section located close to the magnetic detection device and the magnetic field formed by the parallel electric wire section located remote from the magnetic detection device and directed oppositely relative to the former magnetic field in order to detect the intensity of the electric currents flowing through said parallel electric wire sections, wherein the parallel electric wire section locate close to said magnetic detection device and the parallel electric wire section located remote from said magnetic detection device are coupled at respective one ends thereof within the sensor.

2. A sensor according to claim 1, wherein the magnetic field applied to said magnetic detection device is within a range of ±15 mT relative to the largest current value to be metered.

3. A sensor according to claim 1, wherein the parallel electric wire section located close to said magnetic detection device and the parallel electric wire section located remote from said magnetic detection device are connected to each other at respective one ends by way of a U-shaped electric wire section.

4. A sensor according to claim 1, wherein said parallel electric wire sections have an oblong rectangular cross section extending in the magnetic field detecting direction of said magnetic detection device and the width of the cross section as viewed in the longitudinal direction is greater than the length of the detecting section of the device.

5. A sensor according to claim 4, wherein the gap d separating said parallel electric wire sections is smaller tan the distance s separating the parallel electric wire section located close to said magnetic detection device and said magnetic detection device.

6. A sensor according to claim 5, further comprising:

a magnetic shield surrounding said parallel electric wire sections and said magnetic detection device with the inner wall surface of said magnetic shield separated from said parallel electric wire sections by a distance greater than d+s.

7. A current detection unit comprising:

a current sensor including:

parallel electric wire sections of a pair of electric wires arranged in parallel with each other and adapted to flow respective electric currants of the same intensity in directions opposite to each other; and a magnetic detection device having a magnetic body adapted to allow high frequency currents to directly flow through it and change its magnetic permeability in response to the external magnetic field, said magnetic detection device having a magnetic field detecting direction rectangular relative to a prolonged line connecting centers of said parallel electric wire sections and being adapted to detect the difference between the magnetic field formed by the parallel electric wire section located close to the magnetic detection device and the magnetic field formed by the parallel electric wire section located remote from the magnetic detection device and directed oppositely relative to the former magnetic field in order to detect the intensity of the electric currents flowing through said parallel electric wire sections;

a circuit substrate carrying said magnetic detection device and said parallel electric wire sections thereon, said circuit substrate being provided at a part thereof with a through hole or notch, free ends of said parallel electric wire sections being exposed to the outside through said through hole or notch; and a detection circuit arranged on said circuit substrate to detect the output of the current detection unit by way of said magnetic detection device, wherein the parallel electric wire section locate close to said magnetic detection device and the parallel electric wire section located remote from said magnetic detection device are coupled at respective one ends thereof within the sensor.

8. A unit according to claim 7, wherein said detection circuit detects the change in the impedance at the opposite ends of the magnetic body of said magnetic detection device.

9. A unit according to claim 7, further comprising:

a coil arranged close to said magnetic detection device, said detection circuit being adapted to detect the change in the voltage produced in said coil.

10. A unit according to claim 7, further comprising:

a magnetic shield member surrounding said current sensor and said circuit substrate.

11. A unit according to claim 10, wherein the gap separating said parallel electric wire sections in said magnetic shield member and the gap separating said parallel electric wire sections projecting from said magnetic shield member differ from each other.

12. A current detection unit according to claim 7, wherein said magnetic detection device is arranged on the prolonged line.

13. A current sensor according to claim 1, wherein said magnetic detection device is arranged on the prolonged line.

* * * * *

UNITED STATES PATENT AND TRADEMARK OFFICE
CERTIFICATE OF CORRECTION

| | | |
|---|---|---|
| PATENT NO. | : 6,989,666 B2 | Page 1 of 1 |
| APPLICATION NO. | : 10/810580 | |
| DATED | : January 24, 2006 | |
| INVENTOR(S) | : Masahiro Kawase | |

It is certified that error appears in the above-identified patent and that said Letters Patent is hereby corrected as shown below:

COLUMN 4:
      Line 11, "indicted" should read --indicated--.

COLUMN 5:
      LINE 48, "preferably" should read --preferable--.

COLUMN 8:
      Line 8, "wit" should read --with--.
      Line 22, "sections" should read --sections, and --.
      Line 23, insert two spaces before "wherein".
      Line 23, "locate" should read --located--.
      Line 45, "tan" should read --than--.
      Line 59, "currants" should read --currents--.

COLUMN 9:
      Line 20, insert two spaces before "wherein".
      Line 20, "locate" should read --located--.

Signed and Sealed this

Twenty-eighth Day of November, 2006

JON W. DUDAS
*Director of the United States Patent and Trademark Office*